United States Patent
Brodie

(10) Patent No.: US 7,615,747 B1
(45) Date of Patent: Nov. 10, 2009

(54) SAMPLING FEEDBACK SYSTEM

(75) Inventor: Alan D. Brodie, Palo Alto, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 295 days.

(21) Appl. No.: 11/865,688

(22) Filed: Oct. 1, 2007

Related U.S. Application Data

(60) Provisional application No. 60/970,323, filed on Sep. 6, 2007.

(51) Int. Cl.
*H01J 37/29* (2006.01)
(52) U.S. Cl. ..................................................... 250/310
(58) Field of Classification Search ................. 250/310, 250/306, 307

See application file for complete search history.

(56) References Cited

U.S. PATENT DOCUMENTS 6,545,275 B1 * 4/2003 Pearl et al. ..................... 850/7

* cited by examiner

*Primary Examiner*—Kiet T Nguyen
(74) *Attorney, Agent, or Firm*—Luedeka, Nelly & Graham, P.C.

(57) ABSTRACT

An electron microscope includes an electron beam source, which produces an electron beam. Scan deflectors direct the electron beam in a pattern across a sample, which thereby emits electrons. The pattern includes line portions and retrace portions. A main detector receives the electrons emitted by the sample, and produces a main signal. Blankers redirect the electron beam into a reference detector during at least a portion of the retrace portions of the pattern. The reference detector receives the electron beam and produces a reference signal. A mixing circuit receives the main signal and the reference signal and adjusts the main signal based at least in part on the reference signal, thereby producing an adjusted signal. An image computer receives the adjusted signal and produces an image of the sample based at least in part on the line portions of the adjusted signal.

20 Claims, 2 Drawing Sheets

SAMPLING FEEDBACK SYSTEM

This application claims all priorities and other benefits of prior pending U.S. provisional application 60/970,323, filed 2007 Aug. 6.

FIELD

This invention relates to the field of integrated circuit fabrication. More particularly, this invention relates to inspecting integrated circuits with scanning electron microscopes.

BACKGROUND

Because of the high complexity of modern integrated circuits, and the delicacy of the processes by which they are formed, they are traditionally inspected at many different times during fabrication. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

As used in the art, the term "inspection" is typically limited to an image-type inspection of the integrated circuits, rather than an electrical "inspection," which is typically referred to as "testing." Inspection is also performed on other types of items that are used in the integrated circuit fabrication process, such as masks and reticles. As used herein, the term "substrate" applies without limitation to integrated circuits, the wafers on which they are formed, masks, and reticles.

One powerful tool that is used in the inspection of substrates is the cold field-emission electron microscope. "Cold field" refers to the fact that the filament in the instrument's electron gun operates at room temperature. Cold field emitters have advantages in high resolution electron microscopes because they have both a relatively small virtual source size of less than about five nanometers, and a relatively low energy spread of less than about three-tenths of an electron volt. One disadvantage of cold field emitters is ion bombardment and the flicker noise that is associated with atoms moving on the surface of the tip. For example, the flicker noise from the total emission current from a HfC emitter is typically about five percent during the stable emission time (after flashing), and the probe current noise is typically larger.

The present technique for reducing the effect of flicker noise in the image is to measure the beam current in an annular region around the electron beam, and then adjust the amplitude of the detected signal as the fluctuations occur. Unfortunately, this method assumes that there is a good correlation between the measured current in the annular region and the actual probe current, which is not always a valid assumption.

What is needed, therefore, is a system that overcomes problems such as those described above, at least in part.

SUMMARY

The above and other needs are met by an electron microscope according to an embodiment of the present invention. An electron beam source produces an electron beam, and scan deflectors direct the electron beam in a pattern across a sample, which thereby emits electrons. The pattern includes line portions and retrace portions. A main detector receives the electrons emitted by the sample, and produces a main signal. Blankers redirect the electron beam into a reference detector during at least a portion of the retrace portions of the pattern. The reference detector receives the electron beam and produces a reference signal. A mixing circuit receives the main signal and the reference signal and adjusts the main signal based at least in part on the reference signal, thereby producing an adjusted signal. An image computer receives the adjusted signal and produces an image of the sample based at least in part on the line portions of the adjusted signal.

In this manner, the electron beam itself is sensed by the reference detector, to produce a signal that is used to adjust the final image. This produces a better image because an estimate of the electron beam is not used for this purpose, rather, a direct measurement is used. Further, the measurement of the electron beam is accomplished during a portion of the scan pattern—the retrace periods—when the image is not being constructed. Thus, the implementation of the various embodiments of the present invention does not reduce the image acquisition speed of the electron microscope.

In various embodiments, the reference detector is a high speed pin diode detector. In some embodiments a beam limiting aperture is disposed between the electron beam source and the blankers. Some embodiments include an objective lens that is disposed between the scan deflectors and the sample. In some embodiments a preamplifier is disposed between the main detector and the reference detector on one side and the mixing circuit on another side, for amplifying both the main signal and the reference signal prior to adjusting the main signal. Some embodiments include a digitizer for digitizing the main signal. In some embodiments a digitizer digitizes the reference signal. Some embodiments have a digitizer for digitizing the adjusted signal. In some embodiments a digitizer is disposed between the main detector and the reference detector on one side and the mixing circuit on another side, for digitizing the main signal and the reference signal prior to producing the adjusted signal. Some embodiments provide a display for presenting the image of the sample produced by the image computer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Various embodiments of the present invention provide for sampling the actual beam current, rather than just assuming that there is a good correlation between the probe current and the current as measured in an annular or other nearby region.

Figure 1:
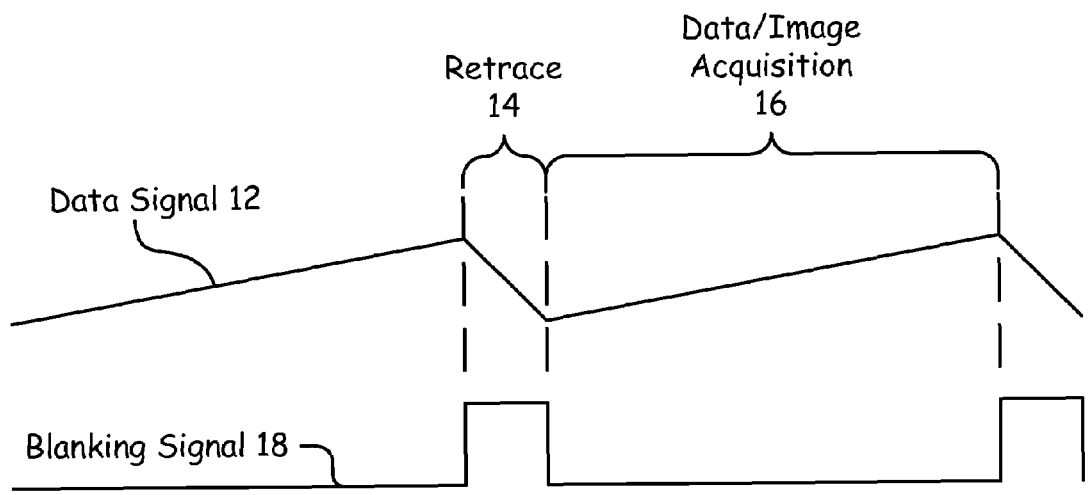
FIG. 1 depicts the relationship between a data acquisition signal and a blanking signal, showing the retrace portions of the data acquisition signal, which portions are used for sensing the beam according to an embodiment of the present invention.

As a part of this, an image is formed by raster scanning the electron beam over the sample. FIG. 1 shows the timing of the fast scanning direction. Depicted are the data signal 12 and the blanking signal 18. The data signal 12 is used to construct the image of the sample, and the blanking signal 18 is used to blank the data signal 12 during the retrace periods 14, when the electron beam is moved from the end of a prior scan line to the beginning of a subsequent scan line. The electron beam is swept over the sample, such as by deflectors, and the image is acquired during the slow part 16 of the ramp. The beam is then sent back to start another line, in a portion of the signal called the retrace 14. During the retrace 14 the image is not acquired.

Figure 2:
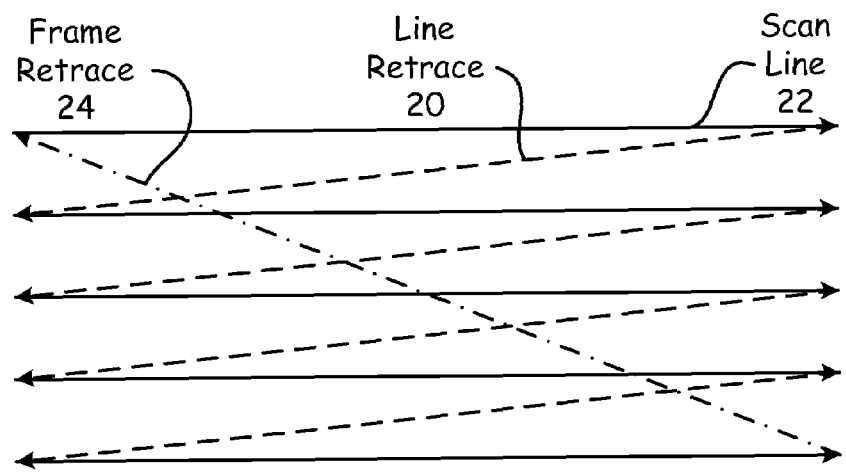
FIG. 2 depicts a representation of the formation of the lines in a frame of an image, showing the retrace portions of the data acquisition signal, which portions are used for sensing the beam according to an embodiment of the present invention.

FIG. 2 shows this process of constructing an image or frame diagrammatically. A scan line 22 is acquired from the data signal 12 during the data acquisition ramp 16. The data signal 12 is blanked by the blanking signal 18 during the line retrace 20. The data signal 12 is also blanked during the frame retrace 24, when a new image frame is started. It is during one or more of these retrace periods 14 that the electron beam is sampled so as to apply the corrections, as described in more detail below.

During the retrace time 14 the beam current is measured, which in one embodiment is accomplished by moving the beam off axis and into a detector. Because the retrace time 14 is typically quite short, on the order of micro-seconds, in one embodiment a blanker with high speed electronics is used to steer the beam into a high speed detector. "High speed" is used because it is preferred that the beam not have any residual deflections or motion during the imaging period 16 of the scan. "High speed" as used herein means rise and fall times of less than about one hundred nanoseconds.

Figure 3:
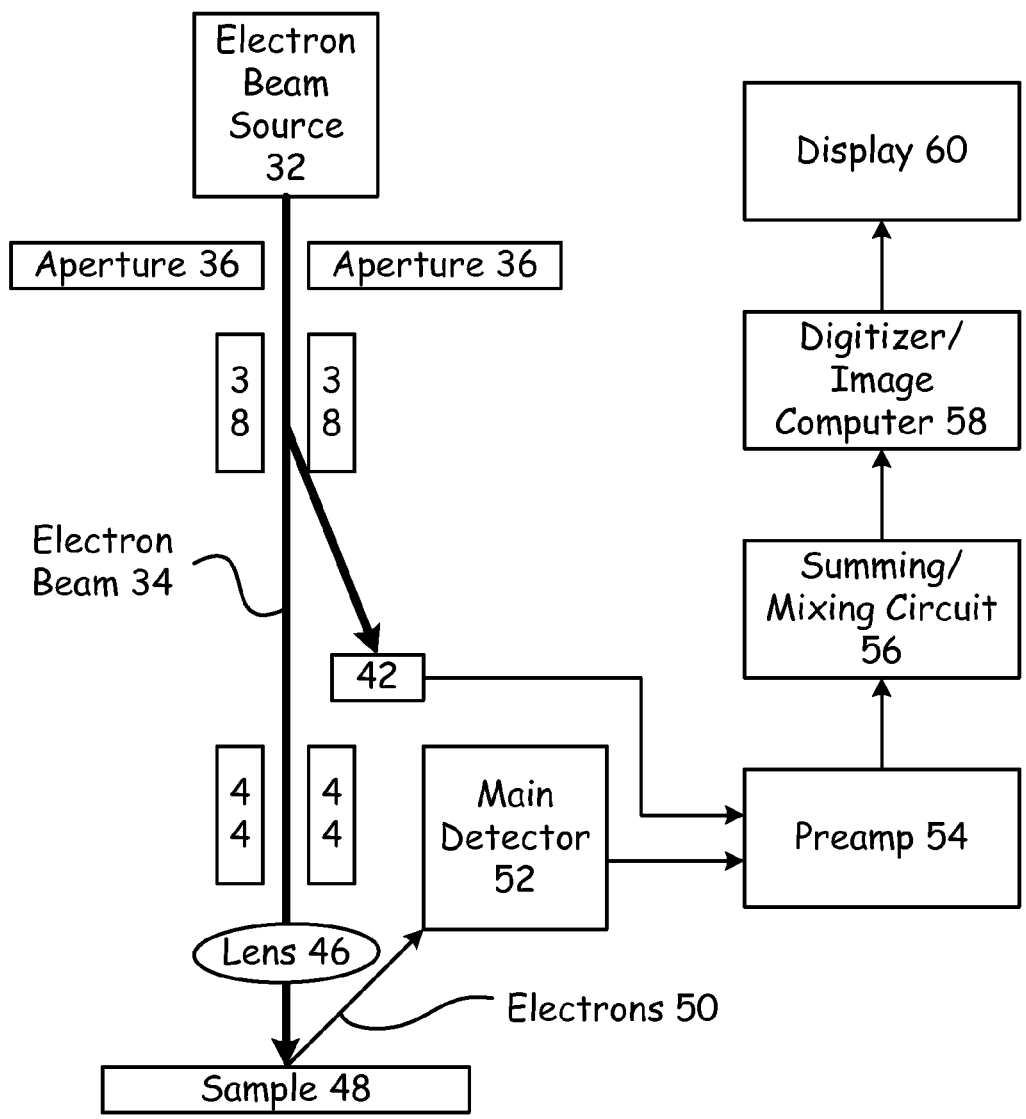
FIG. 3 is a functional block diagram of an electron microscope according to an embodiment of the present invention.

With reference now to FIG. 3, there is depicted a functional block diagram of an electron microscope 30 according to an embodiment of the present invention. An electron beam source 32 produces an electron beam 34, which passes through a beam limiting aperture 36, main scan deflectors 44, and an objective lens 46, before impinging upon a sample 48, such as the substrates described above. The energy of the electron beam 34 causes electrons 50 to be emitted by the sample 48, which electrons 50 are sensed by a main detector 52.

During at least a portion of one or more of the retrace periods 14, including both line and frame retrace periods, high speed blankers 38 are used to steer the electron beam 34 away from the sample 48 and onto a detector 42, such as a high speed pin diode detector, which senses the current of the electron beam 34. Such detectors 42 generally have high gain, are fast, and typically exhibit long lifetimes. The detector 42 can be the same type or similar to the main 52, secondary, or backscatter detector already used in the electron microscope 30.

The signals from both the detector 42 and the main detector 52 are, in this embodiment, fed into a preamp 54, and then are fed into a summing/mixing circuit 56, where the signal from the detector 42 is used to adjust the signal from the main detector 52. The signal output from the detector 42 is used, for example, to modulate the gray scale values of the line scans output by the main detector 52. One method of doing this is to multiply all pixels in the signal line produced by the main detector 52 by the signal output from the noise detector 42. In this manner, each line is normalized in amplitude by the same ratio of current fluctuations. This strategy can be performed either in the analog domain or the digital domain.

In the embodiment as depicted, this adjusted signal is provided to a digitizer/image computer 58, where the analog signal is digitized and assembled into images of the sample 48, which are then presented, such as on a display 60. Because the current fluctuation follows a 1/f distribution, in some embodiments the historical data from the detector 42 (such as could be collected over many lines and frames) is used to make other adjustments to the image for noise reduction purposes.

Various known elements and operations of an electron microscope—other than the new elements and operations described herein—are described in U.S. Pat. No. 5,502,306, the disclosure of which is incorporated herein, and to which the reader is referred for a more thorough description of the construction and operation of such microscopes.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An electron microscope, comprising:
    an electron beam source for producing an electron beam,
    scan deflectors for directing the electron beam in a pattern across a sample, the sample thereby emitting electrons, the pattern comprising line portions and retrace portions,
    a main detector for receiving the electrons emitted by the sample and thereby producing a main signal,
    blankers for redirecting the electron beam during at least a portion of the retrace portions of the pattern into a reference detector,
    the reference detector for receiving the electron beam and thereby producing a reference signal,
    a mixing circuit for receiving the main signal and the reference signal, and for adjusting the main signal based at least in part on the reference signal, and thereby producing an adjusted signal, and
    an image computer for receiving the adjusted signal and producing an image of the sample based at least in part on the line portions of the adjusted signal.

2. The electron microscope of claim 1, wherein the reference detector is a high speed pin diode detector.

3. The electron microscope of claim 1, further comprising a beam limiting aperture disposed between the electron beam source and the blankers.

4. The electron microscope of claim 1, further comprising an objective lens disposed between the scan deflectors and the sample.

5. The electron microscope of claim 1, further comprising a preamplifier disposed between the main detector and the reference detector on one side and the mixing circuit on another side, for amplifying both the main signal and the reference signal prior to adjusting the main signal.

6. The electron microscope of claim 1, further comprising a digitizer for digitizing the main signal.

7. The electron microscope of claim 1, further comprising a digitizer for digitizing the reference signal.

8. The electron microscope of claim 1, further comprising a digitizer for digitizing the adjusted signal.

9. The electron microscope of claim 1, further comprising a digitizer disposed between the main detector and the reference detector on one side and the mixing circuit on another side, for digitizing the main signal and the reference signal prior to producing the adjusted signal.

10. The electron microscope of claim 1, further comprising a display for presenting the image of the sample produced by the image computer.

11. An electron microscope, comprising:
an electron beam source for producing an electron beam,
scan deflectors for directing the electron beam in a pattern across a sample, the sample thereby emitting electrons,
the pattern comprising line portions and retrace portions,
a main detector for receiving the electrons emitted by the sample and thereby producing a main signal,
blankers for redirecting the electron beam during at least a portion of the retrace portions of the pattern into a reference detector,
the reference detector for receiving the electron beam and thereby producing a reference signal,
a preamplifier for amplifying both the main signal and the reference signal,
at least one digitizer for digitizing the main signal and the reference signal,
a mixing circuit for receiving the digitized main signal and the digitized reference signal, and for adjusting the main signal based at least in part on the reference signal, and thereby producing an adjusted signal, and
an image computer for receiving the adjusted signal and producing an image of the sample based at least in part on the line portions of the adjusted signal.

12. The electron microscope of claim 11, wherein the reference detector is a high speed pin diode detector.

13. The electron microscope of claim 11, further comprising a beam limiting aperture disposed between the electron beam source and the blankers.

14. The electron microscope of claim 11, further comprising an objective lens disposed between the scan deflectors and the sample.

15. The electron microscope of claim 11, further comprising a display for presenting the image of the sample produced by the image computer.

16. An electron microscope, comprising:
an electron beam source for producing an electron beam,
scan deflectors for directing the electron beam in a pattern across a sample, the sample thereby emitting electrons,
the pattern comprising line portions and retrace portions,
a main detector for receiving the electrons emitted by the sample and thereby producing a main signal,
blankers for redirecting the electron beam during at least a portion of the retrace portions of the pattern into a reference detector,
the reference detector for receiving the electron beam and thereby producing a reference signal,
a preamplifier for amplifying both the main signal and the reference signal,
a mixing circuit for receiving the amplified main signal and the amplified reference signal, and for adjusting the main signal based at least in part on the reference signal, and thereby producing an adjusted signal,
a digitizer for digitizing the adjusted signal, and
an image computer for receiving the adjusted signal and producing an image of the sample based at least in part on the line portions of the adjusted signal.

17. The electron microscope of claim 16, wherein the reference detector is a high speed pin diode detector.

18. The electron microscope of claim 16, further comprising a beam limiting aperture disposed between the electron beam source and the blankers.

19. The electron microscope of claim 16, further comprising an objective lens disposed between the scan deflectors and the sample.

20. The electron microscope of claim 16, further comprising a display for presenting the image of the sample produced by the image computer.

\* \* \* \* \*